United States Patent [19]
Lowenthal

[11] Patent Number: 5,176,312
[45] Date of Patent: Jan. 5, 1993

[54] SELECTIVE FLOW SOLDERING APPARATUS

[76] Inventor: Brian Lowenthal, 3960 Arthur Ave., Lincolnwood, Ill. 60645

[21] Appl. No.: 745,052

[22] Filed: Aug. 12, 1991

[51] Int. Cl.$^5$ .............................................. B23K 31/02
[52] U.S. Cl. .................... 228/180.1; 228/260
[58] Field of Search ............... 228/180.1, 37, 260, 228/102; 118/315, 411

[56]           References Cited
          U.S. PATENT DOCUMENTS

| | | | |
|---|---|---|---|
| 2,870,532 | 1/1959 | Young | 228/180.1 |
| 4,030,717 | 6/1977 | Serlovsky | 228/37 |
| 4,412,641 | 11/1983 | Fuchs et al. | |
| 4,506,820 | 3/1985 | Brucker | |
| 4,530,458 | 7/1985 | Kondo | 228/37 |
| 4,540,114 | 9/1985 | Pachschwoll | 228/37 |
| 4,602,730 | 7/1986 | Murakami et al. | 228/37 |
| 4,632,291 | 12/1986 | Rahn | 228/37 |
| 4,659,002 | 4/1987 | Wallgren et al. | |
| 4,700,878 | 10/1987 | Ciniglio | |
| 4,739,919 | 4/1988 | Van Den Brekel et al. | |
| 4,807,794 | 2/1989 | Hess | 228/180.1 |
| 4,887,762 | 12/1989 | Baker | 228/260 |
| 4,890,781 | 1/1990 | Johnson et al. | 228/37 |
| 4,932,585 | 6/1990 | Nakamura | |
| 4,942,997 | 7/1990 | Sinkunas et al. | |
| 4,981,248 | 1/1991 | Hall | |

FOREIGN PATENT DOCUMENTS

| | | | |
|---|---|---|---|
| 0042447 | 4/1977 | Japan | 228/37 |
| 0057157 | 5/1978 | Japan | 128/37 |
| 0022389 | 5/1984 | Japan | 228/37 |
| 0159264 | 9/1984 | Japan | 228/37 |
| 0137670 | 6/1986 | Japan | 228/37 |
| 0093469 | 4/1988 | Japan | 228/37 |

Primary Examiner—Richard K. Seidel
Assistant Examiner—James Miner
Attorney, Agent, or Firm—Emrich & Dithmar

[57] ABSTRACT

A soldering apparatus for selectively soldering designated areas on the surface of a printed circuit (PC) board for mounting multi-pin, through hole circuit components thereto includes a wave solder pot, a fixture for receiving and positioning the PC board over the solder pot, and a plurality of spaced nozzles disposed adjacent a lower surface, i.e., solder side, of the PC board. When actuated, the apparatus directs a solder flow through the nozzles to designated areas corresponding to the location of various components on the PC board. Each nozzle is configured and positioned to match the location and pin pattern of components to be soldered on the PC board for applying solder only to the local area, not affecting adjacent parts, and minimizing the amount of solder applied as well as limiting the temperatures to which the PC board is subjected. The apparatus may be used with either a foam or wave flux application to selected areas of the PC board. A preheater may be included to warm the PC board prior to selective soldering to inhibit board damage. A slide conveyor may be used to transport the PC board on the "X" axis and also permit controlled movement on the "Z" axis to a predetermined height.

17 Claims, 3 Drawing Sheets

SELECTIVE FLOW SOLDERING APPARATUS

FIELD OF THE INVENTION

This invention relates generally to the assembly of printed circuit (PC) boards and is particularly directed to the soldering of multi-pin, through hole components to selected areas on the solder side of a mixed technology PC board.

BACKGROUND OF THE INVENTION

A PC board assembly generally comprises a rigid nonconducting board, also known as a substrate, a plurality of metallic conductors of predetermined length on at least one side of the substrate, and a plurality of discrete electronic components secured to the board. The PC board is typically coupled to other circuitry by means of a flexible circuit tape bonded to the board or a multi-pin connector positioned on one of its edges. The term "PC board" as used herein is intended to include printed wiring boards.

The PC board is generally fabricated as follows. First, holes are perforated in the PC board substrate such as by punching, drilling or any other suitable machining process. The leads of electrical components are then inserted through the holes either manually o by machine in a "thru-hole" mounting arrangement. In some cases, the components are surface mounted on the PC board. Where components are thru-hole mounted as well as surface mounted, the PC board is described as being of mixed technology. Following component insertion, component leads are then conductively bonded to predetermined conductors on the PC board. Conductive bonding is typically accomplished by wave soldering involving passing the lower side of the PC board from which the conductive pins of the various components extend through a molten solder bath. The molten solder bath extends the full width of the PC board and covers the entire lower surface of the PC board as the PC board is transported over the solder bath. A rosin-based or organic acid flux is generally applied to the PC board prior to soldering for improved adherence.

In surface mounted technology, a solder paste is applied to designated areas of the PC board using a screen process. The solder paste is applied at room temperature on the component, or "upper", side of the PC board on "footprints" where the components, or devices, are to be mounted. Surface mounted devices may also be glued to the other side of the PC board. A surface mounted device is placed on each of the paste covered footprints and the PC boards are conveyed through an oven, or other heating apparatus, melting the paste solder in a process termed "reflow."

The solder is typically comprised of a tin-based conductive material heated to a temperature to allow it to flow and be deposited on the PC board's lower surface. This requires the solder to be heated to relatively high temperatures and frequently subjects the PC board itself as well as its associated circuitry to excessively high temperatures. When excessively heated, electronic components may fail, electrical connections may become undone, and the PC board itself may become warped preventing the solder from being deposited uniformly over its entire lower surface. Any one of these results gives rise to PC board failure either during or after production. While detection of a failed PC board can be corrected during production, this slows down production and limits final product output. A failure following production such as after purchase is frequently even more expensive and inevitably reflects adversely on the producer.

OBJECTS AND SUMMARY OF THE INVENTION

These limitations of the prior art are addressed and overcome by the inventive selective flow soldering apparatus which minimizes the amount of solder employed, limits the temperatures to which the PC board is subjected, and provides high speed, automatic mounting of circuit components to a PC board.

Accordingly, it is an object of the present invention to provide an improved apparatus for applying a limited amount of solder to selected areas of a PC board for mounting multipin, through hole components thereto.

Another object of the present invention is to minimize the amount of hot solder applied to and the resulting elevated temperature of a PC board during assembly by applying the solder only to the local areas of the PC board components and not to adjacent portions of the PC board.

A further object of the present invention is to eliminate the requirement for wave soldering an entire surface of a PC board and to limit flux preparation and soldering to only those portions where PC board components are mounted.

These objects of the present invention are achieved and the disadvantages of the prior art are eliminated by apparatus for mounting a plurality of electronic circuit elements on a printed circuit (PC) board wherein the circuit elements are disposed in a spaced manner on a first surface of the PC board and each circuit element includes a plurality of conductive pins inserted through apertures in the PC board and arranged in a given pattern, the apparatus comprising: a solder pot containing a tin-based solder in molten form; a pump disposed in the molten solder for pumping the solder out of the solder pot; and a plurality of spaced nozzles disposed within the solder pot and coupled to the pump, wherein each of the nozzles includes an open upper portion for applying molten solder to a second, opposed surface of the PC board for mounting the circuit elements on the PC board, and wherein the plurality of nozzles are arranged in a spaced manner with each nozzle configured in accordance with the pin pattern of and positioned in alignment with its associated circuit element.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION

Figure 1:
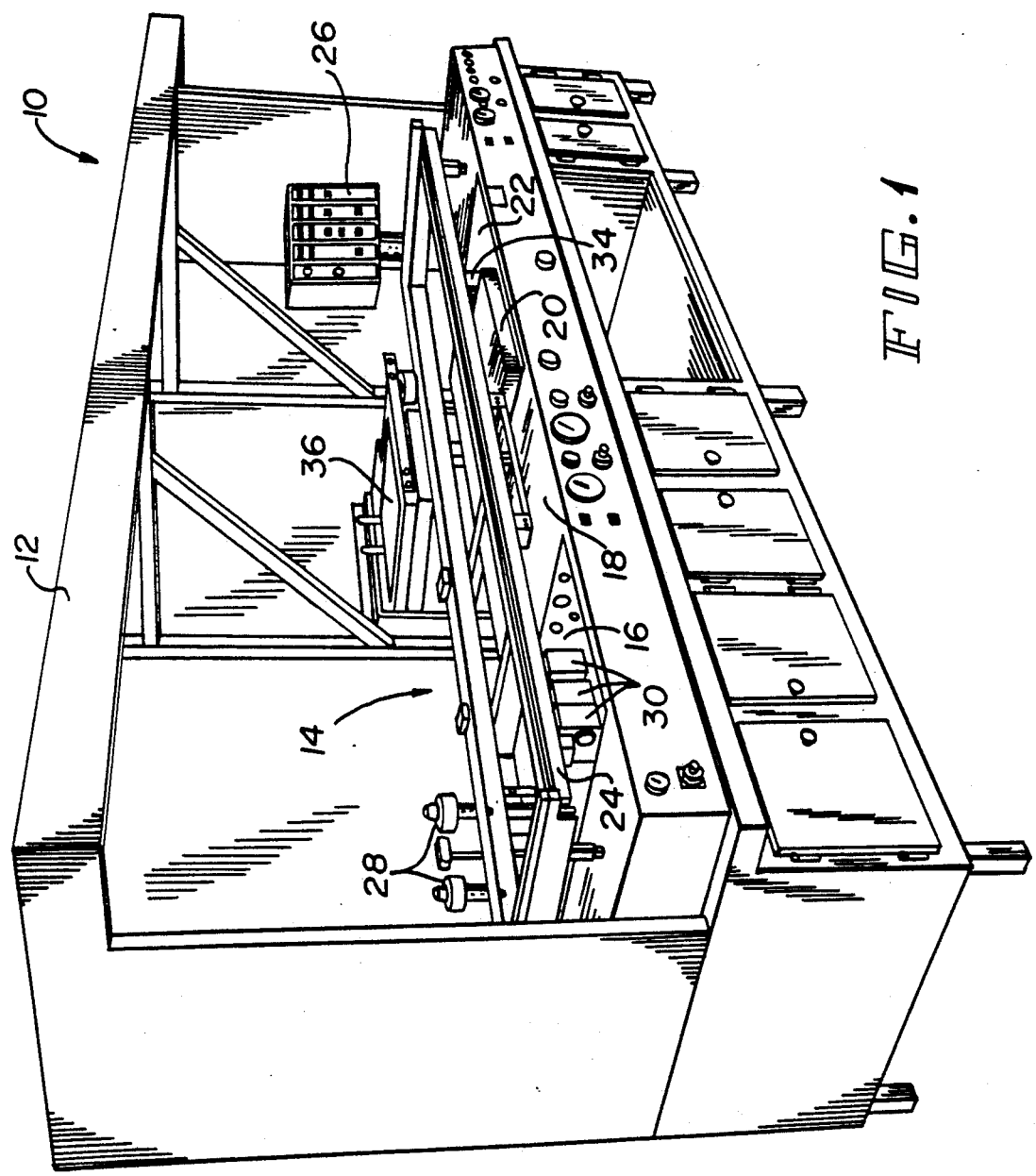
FIG. 1 is a perspective view of a selective flow soldering apparatus in accordance with the present invention.

Referring to FIG. there is shown a perspective view of a selective flow soldering apparatus 10 in accordance with the principles of the present invention. The selective flow soldering apparatus 10 includes an upper hood 12 and a lower printed circuit (PC) board processing section 14. The PC board processing section 14 includes a multi-station arrangement for preparing, mounting and soldering electronic circuit components to a PC board which is transported from station-to-station by means of a PC board transport mechanism 24 which includes a pair of spaced slide rails for supporting the PC board. The PC board may be moved either manually or automatically by means of suitable displacement and control means from station-to-station along the pair of spaced slide rails. The PC board transport mechanism 24 as well as the various stations of the selective flow soldering apparatus 10 are under the control of an operator using a controller with a control panel 26. Such parameters as solder temperature, solder thickness and soldering time are under operator control by means of the controller with control panel 26.

Figure 2:
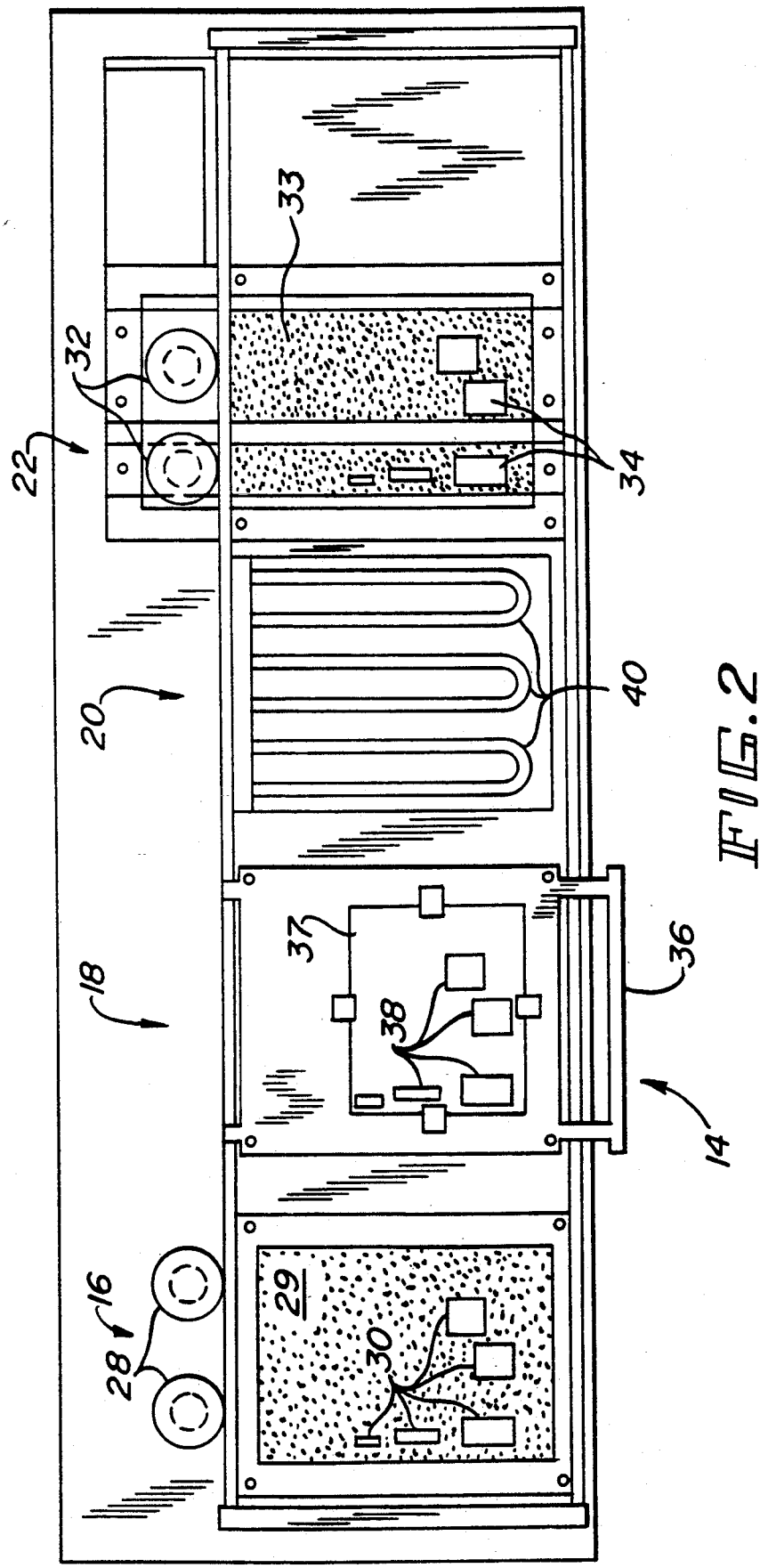
FIG. 2 is a plan view of a portion of the selective flow soldering apparatus of FIG. 1 illustrating the various PC board processing stations therein.

With reference also now to FIG. 2 which is a plan view of the PC board processing section 14, the configuration and operation of the selective flow soldering apparatus 10 will now be described in detail. The first station through which a PC board passes is a flux station 16. Flux station 16 includes one or more flux pumps 28 in combination with a flux pot 29. In a preferred embodiment, the flux within the flux pot 29 is a rosin-based fluid for removing an oxide film from a lower surface of the PC board in preparing the PC board for receiving a solder layer. The flux is pumped upward by means of pumps 28 from the flux pot 29 through a plurality of spaced flux nozzles 30, each of which includes an open upper portion positioned immediately below a lower surface of a PC board. The spacing and size of each of the flux nozzles 30 is such that each covers a lower portion of the PC board where the conductive pins of an electronic component to be soldered to the PC board extend through the PC board to its lower side. Various electronic components and arrangements of electronic components on the PC board may be accommodated by the flux station 16 by merely changing the nozzle size and shape as well as the location of the nozzles within the flux pot 29 to accommodate the configuration and spacing of electronic components.

A PC board with flux disposed on selective portions of its lower surface is then moved to a load station 18. Load station 18 includes a component loading carriage 36 for positioning a plurality of electronic components 38 on an upper surface of the PC board. Electronic components 38 are typically suspended from the component loading carriage 36 which is moved downward toward the PC board for positioning of the electronic components thereon. As shown in FIG. 2, the template 37 of the component loading carriage 36 for supporting and moving the electronic components in position on the PC board matches the size and spacing of the flux nozzles 30 in flux station 16. Positioning of the electronic components 38 on a PC board includes inserting the electronic component leads through mounting holes in the PC board.

Following positioning of the electronic components 38 on the PC board, the partially assembled PC board is moved via the transport mechanism to a preheat station 20 which includes a plurality of heating elements, or heaters, 40. Preheating of the partially assembled PC board with a flux layer thereon, which is typically carried out at approximately 25° F. for on the order of 2 minutes, allows for secure bonding between the flux layer and the solder to be deposited over the flux on the PC board.

The PC board is next moved by the PC board transport mechanism to a soldering station 22 which includes a solder pot 33 having one or more pumps 32 attached thereto. Soldering station 22 further includes a plurality of solder nozzles 34 disposed within the solder pot 33 for directing solder onto the lower surface of the PC board through open upper end portions of the nozzles. The solder is directed up through the solder nozzles 34 by means of the solder pumps 32, with each solder nozzle sized, configured and positioned within the solder pot 33 so as to conform with the positioning of the electronic components 38 on the PC board. The PC board is lowered to a position over the solder pot 33 and immediately above the solder nozzles 34 by means of the PC board transport mechanism as described below. The solder is comprised of a conductive material having high adherence to the flux applied to the PC board and is preferably tin-based.

Figure 3:
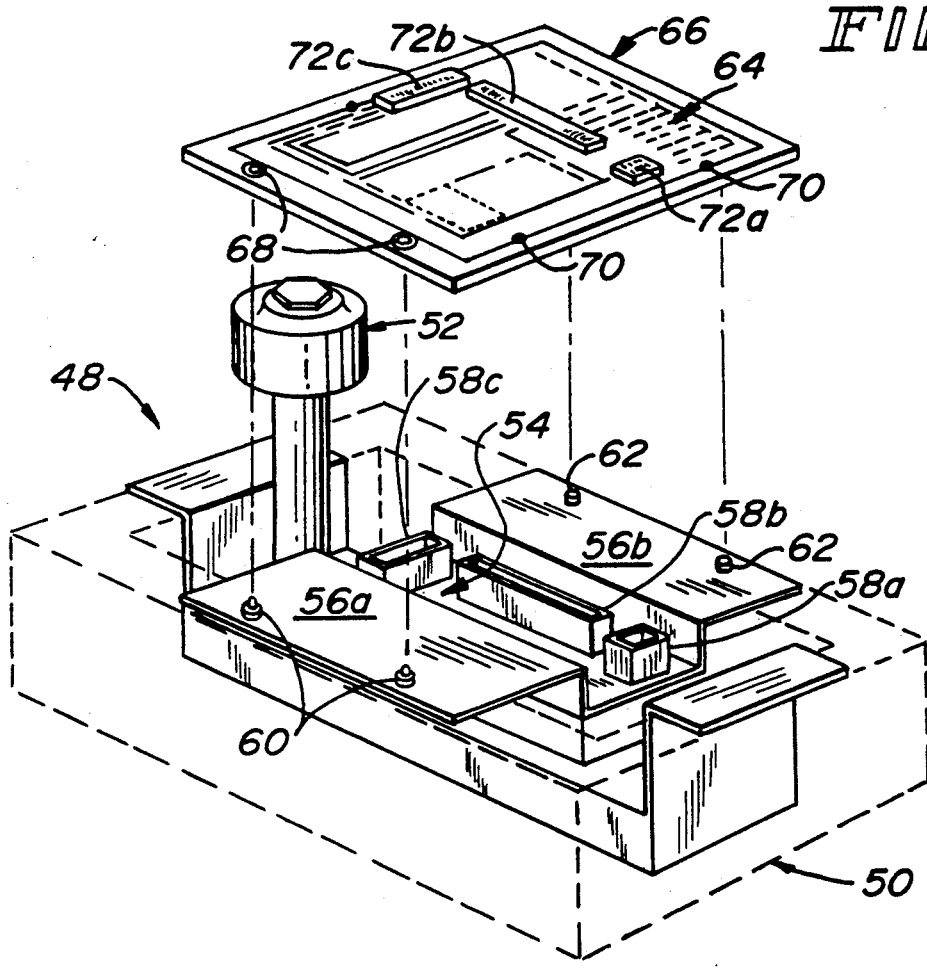
FIG. 3 is a perspective view shown partially in phantom of a soldering module for use in the selective flow soldering apparatus of the present invention.

Referring to FIG. 3, there is shown a perspective view partially in phantom of a selective flow soldering module 48 for use in the soldering station 22. The selective flow soldering module 48 includes a solder pot 50 shown in the figure in dotted-line form having an open recessed portion containing the molten solder. Positioned within the soldering module 48 and submerged in the molten solder is a solder pump 52 for directing the molten solder upward through a plurality of solder nozzles 58a, 58b and 58c. Each of the solder nozzles 58a, 58b and 58c has an open upper end portion through which the solder flows for deposit upon the lower surface of a PC board 64. PC board 64 is initially positioned directly above soldering module 48 by means of the PC board transport mechanism (not shown in FIG. 3 for simplicity). Details of the PC board transport mechanism for positioning the PC board 64 above the soldering module 48 and for lowering the PC board to a position immediately above the soldering module may be conventional in design and operation and are therefore not described in further detail herein. The PC board transport mechanism then lowers the PC board 64 to a position immediately above soldering module 48 and in alignment with solder nozzles 58a, 58b and 58c. From the figure, it can be seen that the solder nozzles 58a, 58b and 58c are sized, configured and positioned to match the size, configuration and spacing of first, second and third printed circuit board components 72a, 72b and 72c disposed on the upper surface of the PC board 64.

Solder nozzles 58a, 58b and 58c are positioned upon and supported by a nozzle plate 54. Nozzle plate 54 includes first and second extensions 56a and 56b which are attached to facing side portions of the solder pot 58 by conventional means such as weldments or mounting screws, which are not shown in the figure for simplicity. A recessed, lower portion of the nozzle plate 54 includes a plurality of spaced apertures each aligned with a respective one of the solder nozzles 58a, 58b and 58c to permit molten solder to flow upward through each of the solder nozzles from the solder pot 50. First nozzle plate extension 56a has attached to an upper surface thereof a pair of pallet locating pins 60. Each of the pallet locating pins 60 includes an upward directed projection, or knob, adapted for insertion in a bushed locating hole 68 in a pallet 66 upon which the PC board 64 is positioned. Pallet 66 transports the PC board 64 under the control of the PC board transport mechanism into proper alignment and spacing relative to the solder nozzles 58a, 58b and 58c in the solder pot 50. Alignment of the pallet locating pins 60 with the bushed locating holes 68 in pallet 66 ensure proper alignment of the three printed circuit board components 72a, 72b and 72c with the three solder nozzles 58a, 58b and 58c. Disposed on the second nozzle plate extension 56b are a pair of pallet levels 62. Pallet levels 62 are adapted to engage the lower surface of the pallet 66 in ensuring proper spacing between the lower surface of the PC board 64 and the open, upper end portions of the solder nozzles 58a, 58b and 58c. The PC board 64 is securely maintained in position on pallet 66 by means of a plurality of PC board hold downs 70 disposed about the periphery of the PC board. The PC board hold downs 70 may take the form of rotatable clips or mounting screws.

Figure 4:
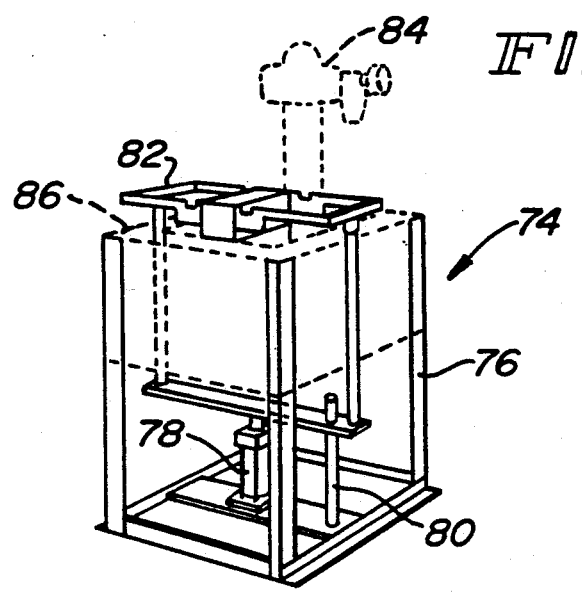
FIG. 4 is a perspective view of a lifter assembly for raising a solder nozzle in elevation for tinning parts which cannot be conveniently lowered.

Referring to FIG. 4, there is shown a perspective view of a lifter assembly 74 which could be used for raising a selective flow soldering module 86 shown in dotted-line form for use in soldering electrical and electronic parts which cannot be conveniently lowered. The lifter assembly 74 is adapted for raising the selective flow soldering module 86 up to two inches and for maintaining the module in an upraised position for several seconds with a suitable timer (not shown). The lifter assembly 74 includes a support frame 76 to which is attached a jack mechanism 78. Jack mechanism 78 is positioned beneath and coupled to a moveable lift frame 82. A lower portion of the lift frame 82 is provided with an aperture adapted to receive an alignment bar 80 coupled to and extending upward from the support frame 76. Fixed alignment between the lift frame 82 and the support frame 76 is maintained by the alignment bar 80 during raising and lowering of the lift frame. Jack mechanism 78 raises and lowers lift frame 82 and may be conventional in design and operation such as a hydraulic piston, a mechanical lift mechanism or a pneumatic jack arrangement. The upper portion of the lift frame 82 wa adapted for positioning beneath and engaging a lower portion of the selective flow soldering module 86 which includes a solder pump 84 as previously described.

There has thus been shown a soldering apparatus for selectively soldering designated areas on the surface of a PC board for mounting multi-pin, through hole circuit components thereon. The apparatus includes a plurality of solder nozzles each disposed adjacent a lower surface of the PC board. Each of the nozzles is configured and positioned to match the location and pin pattern of a respective electronic component for applying solder only to the local area, not affecting adjacent parts of the PC board, for minimizing the amount of solder applied and limiting the temperatures to which the PC board is subjected. The apparatus is also adapted for applying a presoldering flux to selected areas of the PC board as well as to lifting the soldering apparatus for soldering electrical and electronic parts which cannot be conveniently lowered over the solder pot.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. Apparatus for mounting a plurality of electronic circuit elements on a printed circuit (PC) board wherein said circuit elements are disposed in a spaced manner on a first surface of said PC board and each circuit element includes a plurality of conductive pins inserted through apertures in said PC board and arranged in a given pattern, said apparatus comprising:
   a solder pot containing a tin-based molten solder;
   pump means disposed in said molten solder for pumping said solder out of said solder pot; and
   a plurality of spaced nozzle means for alignment with an associated circuit element or elements, each of said nozzle means having as associated circuit element or elements, said nozzle means disposed within said solder pot and coupled to said pump means, wherein each of said nozzle means includes an open upper portion for applying molten solder to a second, opposed surface of the PC board for mounting the circuit elements on the PC board, and wherein said plurality of nozzle means are arranged in a spaced manner with each of said nozzle means configured in accordance with the pin pattern of an associated circuit element or elements.

2. The apparatus of claim 1 wherein each of said nozzle means is comprised of stainless steel.

3. The apparatus of claim 1 further comprising PC board transport means for positioning the PC board above said solder pot, wherein said first surface is an upper surface of the PC board and said second, opposed surface is a lower surface of the PC board.

4. The apparatus of claim 3 further comprising alignment means disposed on an upper portion of said solder pot for ensuring proper positioning of the PC board above and in alignment with said plurality of nozzle means.

5. The apparatus of claim 4 wherein said PC board transport means includes a pair of spaced rails and a vertical positioning arrangement, and wherein said alignment means includes a plurality of spaced locating and leveling pins for engaging the PC board.

6. The apparatus of claim I further comprising elevation means for raising said plurality of nozzle means for applying molten solder to a lower surface of a PC board in a elevated position.

7. The apparatus of claim 1 further comprising a flux station for applying flux to selective portions of the second surface of the PC board prior to application of solder to the PC board, wherein said flux station includes a flux pot, a flux pump and a plurality of flux nozzles.

8. The apparatus of claim 1 further comprising a support plate coupled to said solder pot and disposed above the molten solder therein and further coupled to said nozzle means for providing support therefore.

9. The apparatus of claim 8 further comprising removable coupling means for attaching said support plate to said solder pot and allowing for replacement of said support plate and nozzles attached thereto with another support plate and nozzle configuration.

10. Apparatus for mounting and electrically coupling a plurality of electronic components in a spaced manner to a PC board, wherein each of said electronic components includes an array of conductive pins, said apparatus comprising:

a flux station for applying a flux material to designated areas arranged in a spaced manner on a first surface of the PC board corresponding to the location of each of the electronic components, said flux station including a plurality of spaced flux nozzle means for alignment with an associated electronic component or components, and wherein each flux nozzle means is configured and sized in accordance with the array of conductive pins of a respective one or more of the electronic components;

load station for positioning each of the electronic components on a second, opposed surface of the PC board such that the conductive pins of each electronic component are inserted in and extend through apertures in the PC board; and a soldering station for applying solder over said flux material at each of said designated areas of the PC board in mounting and electrically coupling the electronic components in a spaced manner to the PC board, said soldering station including a plurality of spaced solder nozzle means for alignment with an associated electrical component or components, and wherein each solder nozzle means is configured and sized in accordance with the array of conductive pins of a respective one or more of the electronic components.

11. The apparatus of claim 10 further comprising transport means for displacing the PC board from said flux station to said load station and thence to said soldering station.

12. The apparatus of claim 11 further comprising heater means for heating the PC board and said flux disposed thereon after said electronic components are positioned on the PC board and prior to the application of solder over said flux material.

13. The apparatus of claim further comprising control means for controlling the application of flux and solder to the PC board.

14. The apparatus of claim 13 wherein said control means includes user responsive selector means for entering various parameters of the fluxing and soldering of electronic components on the PC board.

15. The apparatus of claim 14 further comprising alignment means for positioning the PC board directly above and in alignment with said solder nozzle means.

16. The apparatus of claim 15 wherein said alignment means includes a plurality of locating and leveling pins mounted to said solder station.

17. The apparatus of claim 16 wherein said alignment means further includes a pallet for engaging and supporting the PC board and for further engaging said locating and leveling pins in precisely positioning the PC board above and in alignment with said soldering station.

* * * * *

UNITED STATES PATENT AND TRADEMARK OFFICE
CERTIFICATE OF CORRECTION

PATENT NO.  : 5,176,312
DATED       : January 5, 1993
INVENTOR(S) : Brian Lowenthal It is certified that error appears in the above-indentified patent and that said Letters Patent is hereby corrected as shown below:

On the Title page, under item [56] Foreign Patent Documents Japanese reference 0057157 should be in class --228--, not "128".
Column 1, line 27, "o" should be --or--.
Column 3, line 7, after "FIG.", insert --1,--.
Column 5, line 46, "wa" should be --was--.
Column 7, line 19, before the word "load", insert --a--.
Column 8, line 12, after "claim", insert --11--.

Signed and Sealed this

Ninth Day of November, 1993

Attest:

BRUCE LEHMAN

Attesting Officer

Commissioner of Patents and Trademarks